(12) United States Patent
Ebigase

(10) Patent No.: US 12,165,948 B2
(45) Date of Patent: Dec. 10, 2024

(54) BONDED SUBSTRATE, AND METHOD FOR MANUFACTURING BONDED SUBSTRATE

(71) Applicant: NGK INSULATORS, LTD., Nagoya (JP)

(72) Inventor: Takashi Ebigase, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 399 days.

(21) Appl. No.: 17/547,379

(22) Filed: Dec. 10, 2021

(65) Prior Publication Data

US 2022/0102240 A1    Mar. 31, 2022

Related U.S. Application Data

(63) Continuation of application No. PCT/JP2020/027829, filed on Jul. 17, 2020.

(30) Foreign Application Priority Data

Jul. 23, 2019 (WO) .................. PCT/JP2019/028876

(51) Int. Cl.
*H01L 23/373* (2006.01)
*H01L 21/48* (2006.01)

(52) U.S. Cl.
CPC ...... *H01L 23/3735* (2013.01); *H01L 21/4807* (2013.01)

(58) Field of Classification Search
CPC ...................... H01L 23/3735; B60K 2360/785
See application file for complete search history.

(56) References Cited

U.S. PATENT DOCUMENTS

| 2012/0080216 A1* | 4/2012 | Abe .......................... C22C 9/00 420/587 |
| 2014/0291699 A1 | 10/2014 | Yano et al. |
| 2017/0323842 A1 | 11/2017 | Tani et al. |

FOREIGN PATENT DOCUMENTS

| JP | 2002-201076 A | 7/2002 |
| JP | 2007-197229 A | 8/2007 |
| JP | 2013-211545 A | 10/2013 |

(Continued)

OTHER PUBLICATIONS

International Preliminary Report on Patentability received in corresponding International Application No. PCT/JP2020/027829 dated Feb. 3, 2022.

(Continued)

*Primary Examiner* — Evren Seven
(74) *Attorney, Agent, or Firm* — MATTINGLY & MALUR, PC

(57) ABSTRACT

A bonded substrate includes: a silicon nitride ceramic substrate; a copper plate; and a bonding layer bonding the copper plate to the silicon nitride ceramic substrate, wherein the bonding layer has a first interface in contact with the silicon nitride ceramic substrate and a second interface in contact with the copper plate, and contains a nitride and a silicide of an active metal as at least one metal selected from the group consisting of titanium and zirconium, an atomic fraction of nitrogen of the bonding layer is greatest at the first interface and is smallest at the second interface, and a sum of atomic fractions of the active metal and silicon of the bonding layer is smallest at the first interface and is greatest at the second interface.

13 Claims, 19 Drawing Sheets

(56) References Cited

FOREIGN PATENT DOCUMENTS

| JP | 2013-211546 A | 10/2013 |
|----|---------------|---------|
| JP | 2017-035805 A | 2/2017  |
| JP | 2018-506496 A | 3/2018  |
| WO | 2013/094213 A1 | 6/2013 |

OTHER PUBLICATIONS

Written Opinion with partial English translation received in corresponding International Application No. PCT/JP2019/028876 dated Oct. 1, 2019.
International Search Report of PCT/JP2020/027829 dated Sep. 24, 2020.
International Search Report of PCT/JP2019/028876 dated Oct. 1, 2019.
Extended European Search Report received in corresponding European Application No. 20843472.0 dated Aug. 4, 2023.
Intrater, James, "The Challenge of Bonding Metals to Ceramics", Machine Design, Nov. 23, 1989, p. 95-100, vol. 61, Cleveland, OH, US.

* cited by examiner

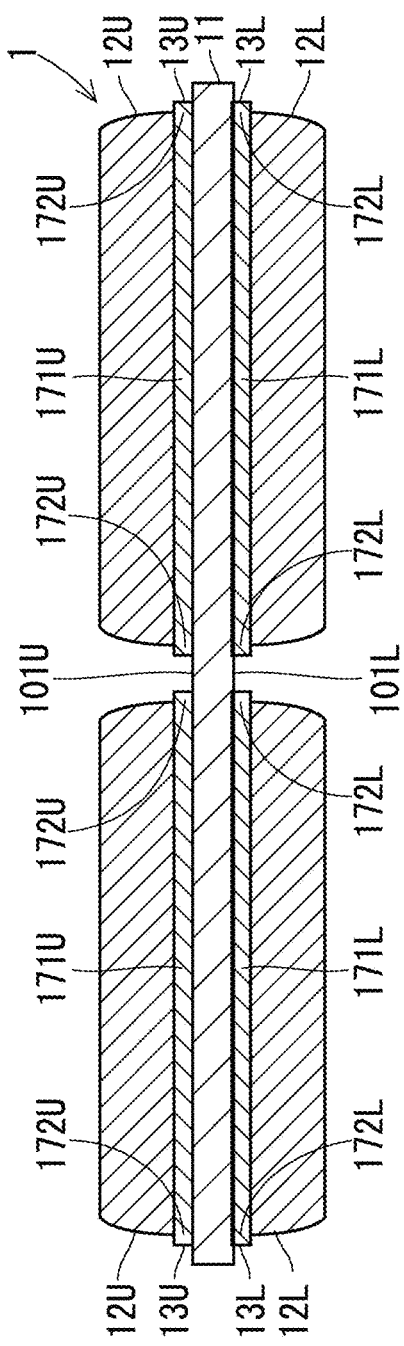

F I G. 2
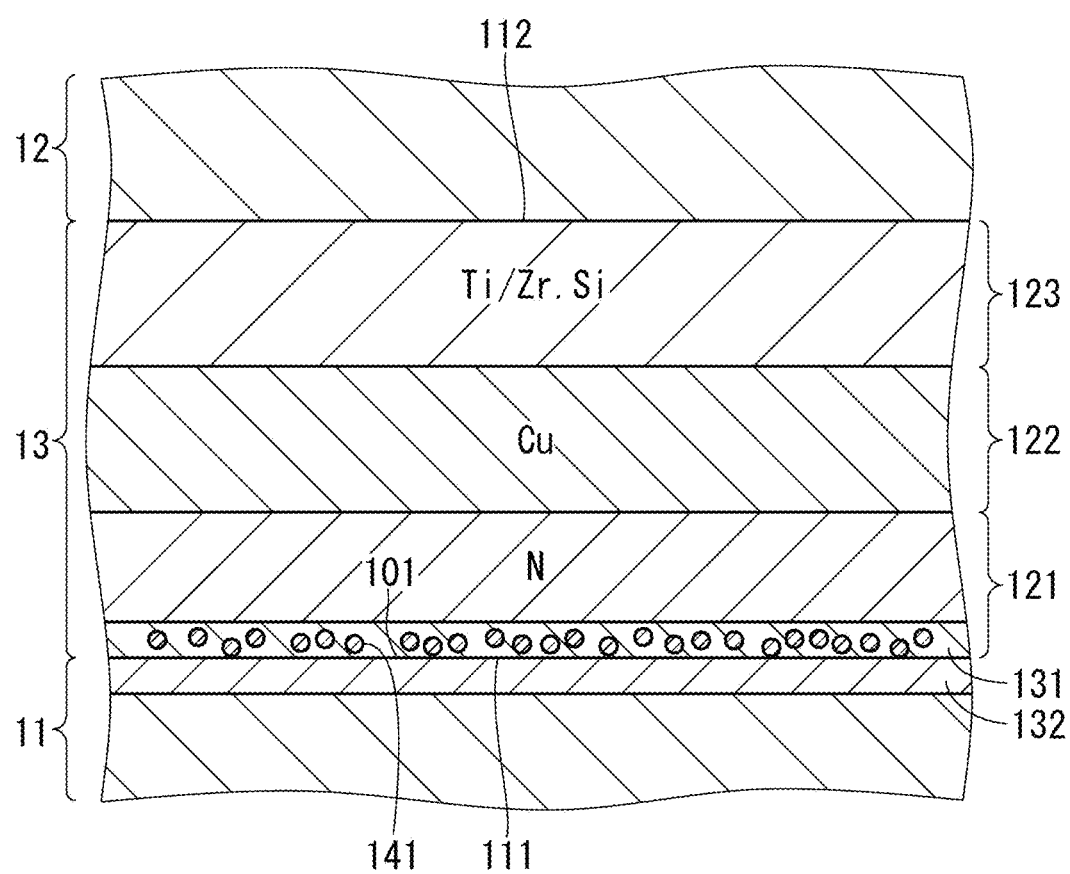

F I G. 4
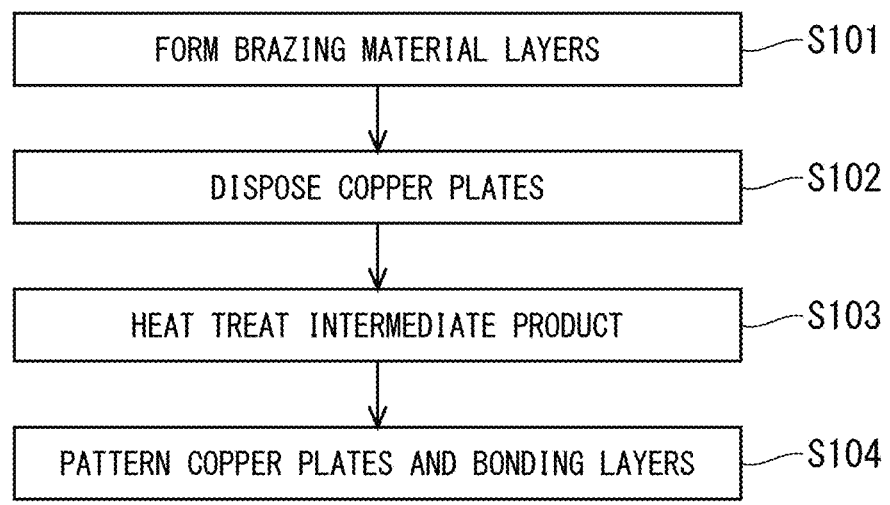

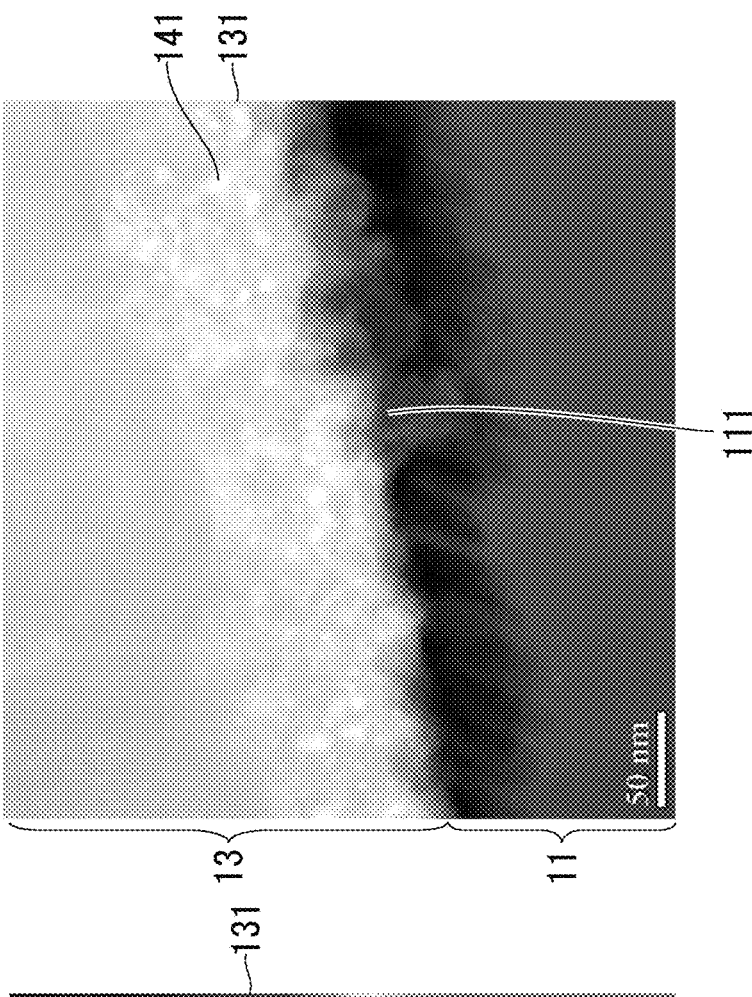
FIG. 12B HAADF-STEM IMAGE
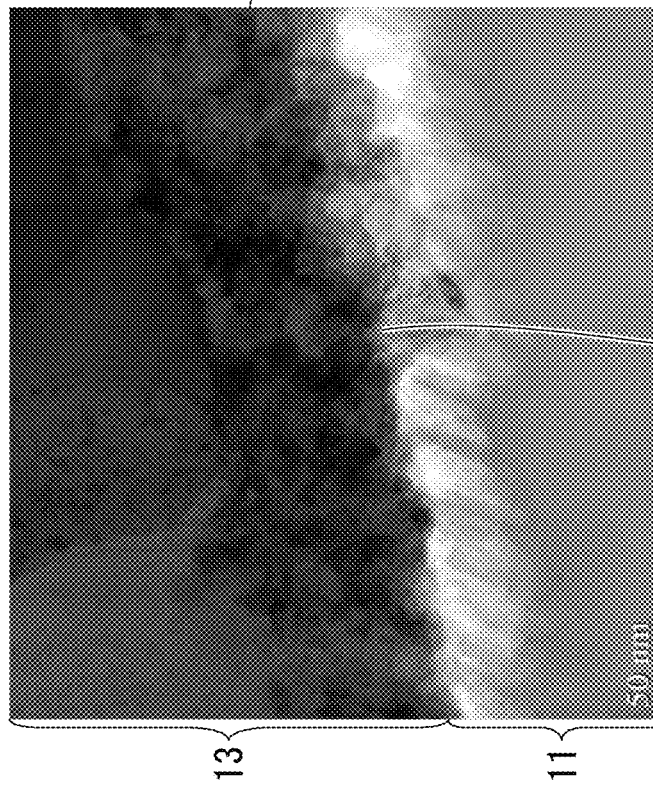
FIG. 12A BF-STEM IMAGE

F I G. 1 5
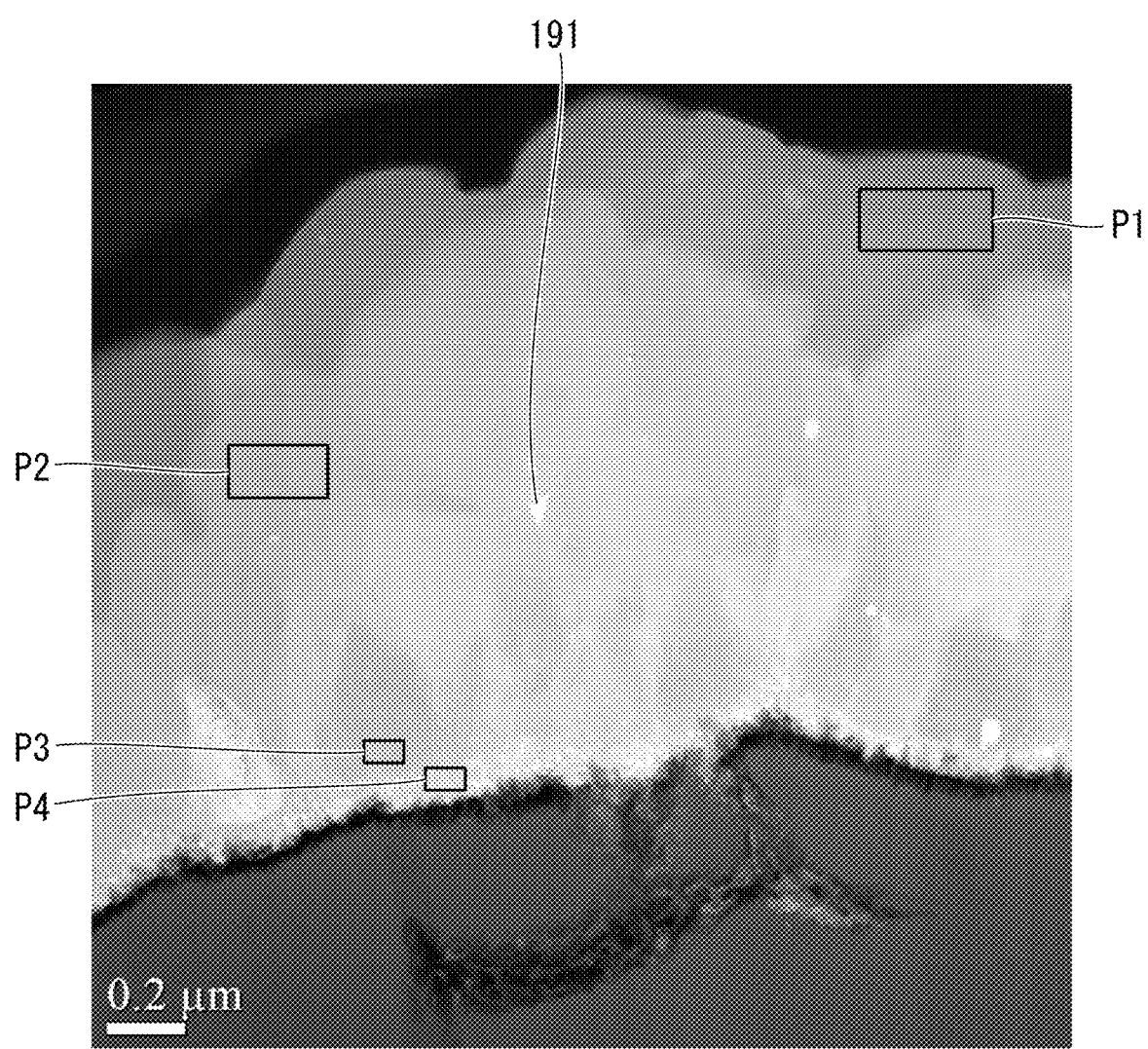

F I G. 1 8
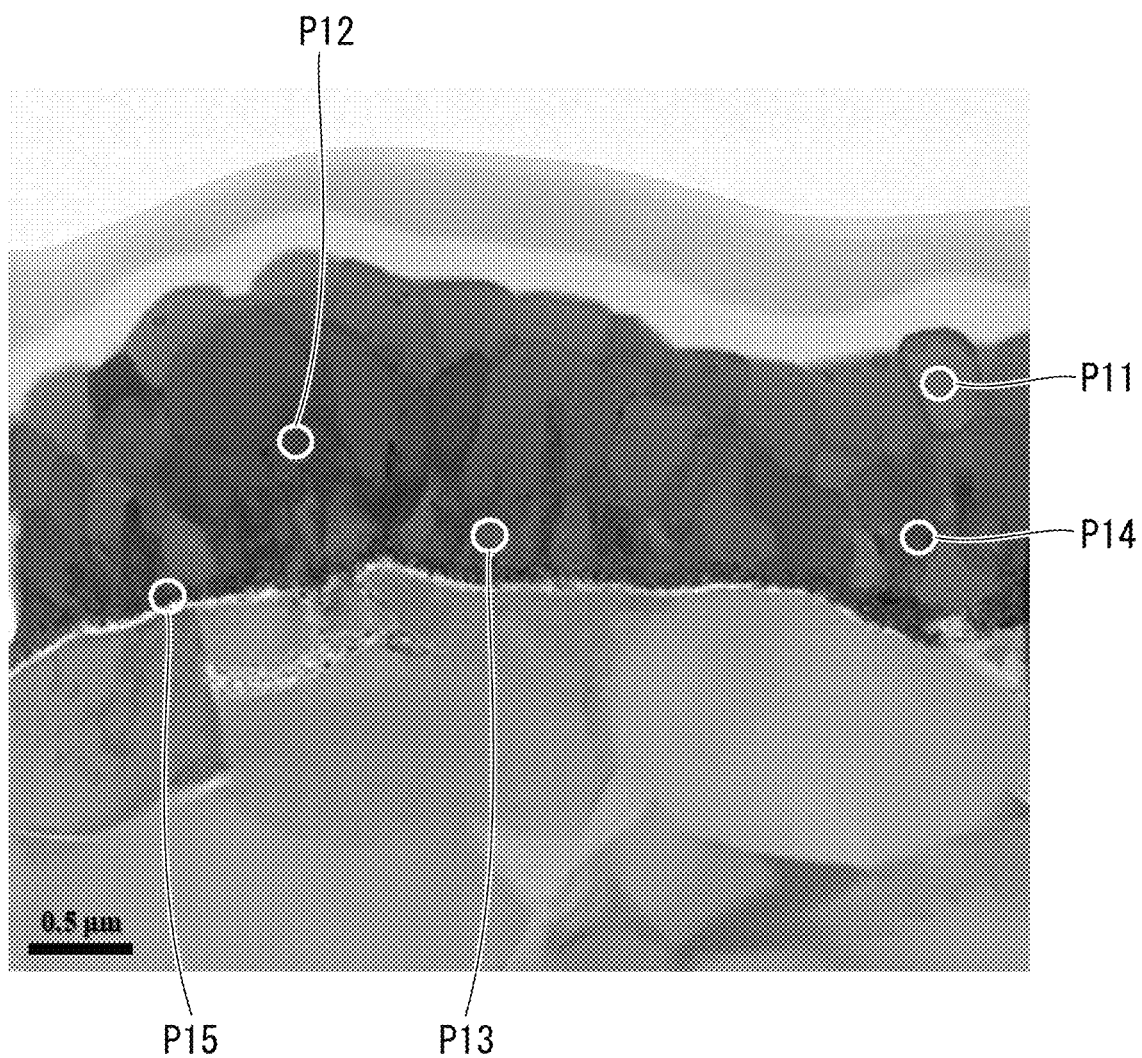

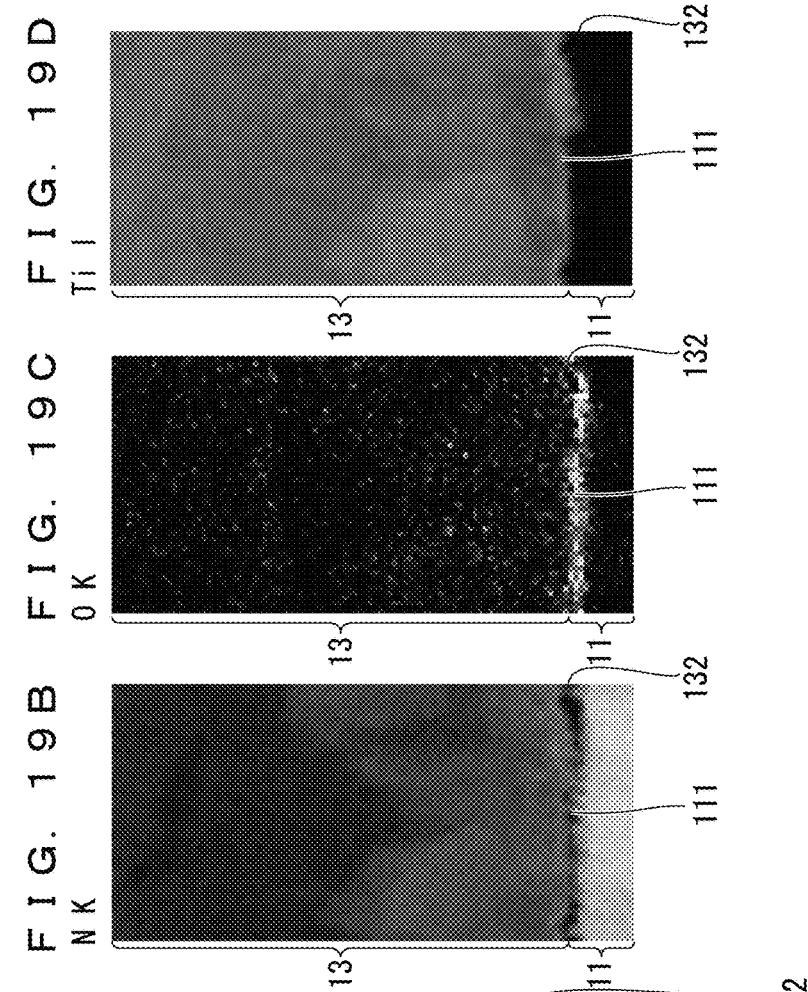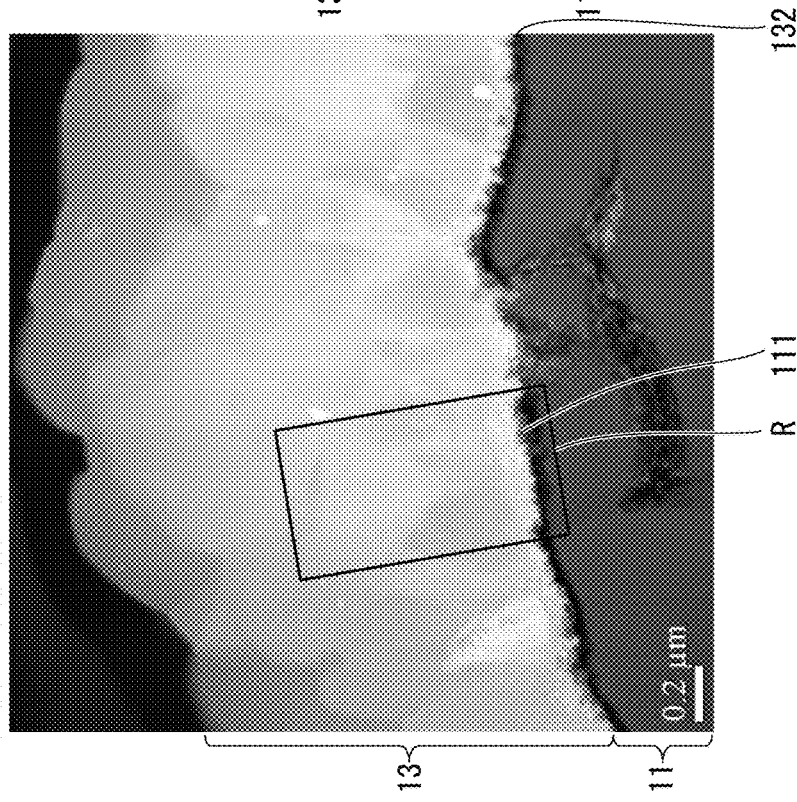

BONDED SUBSTRATE, AND METHOD FOR MANUFACTURING BONDED SUBSTRATE

CROSS-REFERENCE TO RELATED APPLICATION

This application is a continuation application of PCT/JP2020/027829, filed on Jul. 17, 2020, which claims the benefit of priority of Japanese Patent Application No. PCT/JP2019/028876, filed on Jul. 23, 2019, the entire contents of which are incorporated herein by reference.

BACKGROUND OF THE INVENTION

Field of the Invention

The present invention relates to bonded substrates.

Description of the Background Art

Silicon nitride ceramics are highly heat conductive and highly insulating. A bonded substrate in which a copper plate is bonded to a silicon nitride ceramic substrate through a bonding layer is thus suitable for use as an insulating heat-dissipating substrate on which a power semiconductor device is mounted.

In many cases, the bonded substrate is manufactured by preparing an intermediate product in which a brazing material layer is interposed between the copper plate and the nitride ceramic substrate, changing the brazing material layer into the bonding layer through thermal treating on the prepared intermediate product, and patterning the copper plate and the bonding layer (see Japanese Patent Application Laid-Open No. 2002-201076 and Japanese Unexamined Patent Application Publication (Translation of PCT Application) No. 2018-506496, for example).

The brazing material layer includes a powder containing silver and copper and a titanium hydride powder in many cases. The bonding layer includes, as a major component, titanium nitride as a product of reaction of titanium derived from the titanium hydride powder and nitrogen derived from the silicon nitride ceramic substrate in many cases.

In technology disclosed in Japanese Patent Application Laid-Open No. 2002-201076, for example, a metal plate of copper is bonded to a silicon nitride substrate by brazing (paragraph 0016). An Ag—Cu alloy containing an active metal, such as Ti, Zr, and Hf, is used as a brazing material (paragraph 0016). In technology disclosed in Japanese Patent Application Laid-Open No. 2002-201076, TiN particles are sufficiently deposited at an interface between a brazing material layer and silicon nitride to obtain a high bonding strength (paragraph 0018).

Japanese Unexamined Patent Application Publication No. 2018-506496 discloses that a copper plate is bonded to a nitride ceramic substrate, such as a silicon nitride substrate and an aluminum nitride substrate, using an Ag—Cu—Ti-based brazing material to obtain a bonded substrate including a bonding layer containing TiN. A quantity of the brazing material applied at bonding and a bonding condition are adjusted so that no Ag—Cu layer is generated between the copper plate and the bonding layer, to obtain the bonded substrate having an increased reliability in thermal cycling. There are two types of the obtained bonded substrate: a void is formed between the copper plate and the bonding layer, and an Ag-rich phase is formed between the copper plate and the bonding layer in place of the void. The latter is considered to have a high reliability in electrical breakdown.

In conventional technology, however, an adhesion strength between the nitride ceramic substrate and the bonding layer and an adhesion strength between the copper plate and the bonding layer are sometimes incompatible, and, as a result, a bonded substrate having a high bonding strength cannot sometimes be obtained.

In particular, in a case of the bonded substrate disclosed in Japanese Unexamined Patent Application Publication No. 2018-506496, reliability in the thermal cycling is secured by focusing on an interface between the copper plate and the bonding layer, but at least a relationship between a configuration at and near an interface between the nitride ceramic substrate and the bonding layer and an adhesion strength between these layers is not focused on.

Furthermore, in the bonded substrate disclosed in Japanese Unexamined Patent Application Publication No. 2018-506496, instead of forming no Ag—Cu layer, which is undesirable in terms of securement of the thermal cycling, at the interface between the copper plate and the bonding layer, the void is discretely formed at the interface or, in place of the void, the Ag-rich phase is discretely formed at the interface depending on the bonding condition. Such formation of the void or the Ag-rich phase at the interface between the copper plate and the bonding layer is not necessarily desirable in terms of improvement in adhesion strength between the copper plate and the bonding layer.

SUMMARY

The present invention relates to a bonded substrate and, in particular, to a bonding layer thereof.

According to one aspect of the present invention, a bonded substrate includes: a silicon nitride ceramic substrate; a copper plate; and a bonding layer bonding the copper plate to the silicon nitride ceramic substrate, wherein the bonding layer has a first interface in contact with the silicon nitride ceramic substrate and a second interface in contact with the copper plate, and contains a nitride and a silicide of an active metal as at least one metal selected from the group consisting of titanium and zirconium, an atomic fraction of nitrogen of the bonding layer is greatest at the first interface and is smallest at the second interface, and a sum of atomic fractions of the active metal and silicon of the bonding layer is smallest at the first interface and is greatest at the second interface.

According to the present invention, in the bonding layer of the bonded substrate in which the silicon nitride ceramic substrate and the copper plate are bonded to each other, the atomic fraction of nitrogen forming a strong bond with silicon nitride is greatest at the first interface of the bonding layer in contact with the silicon nitride ceramic substrate. Thus, the bonded substrate having higher adhesion between the silicon nitride ceramic substrate and the bonding layer than a bonded substrate not having such distribution of nitrogen is achieved.

Furthermore, according to the present invention, in the bonding layer of the bonded substrate in which the silicon nitride ceramic substrate and the copper plate are bonded to each other, the sum of atomic fractions of the active metal forming a metallic bond with copper and silicon is greatest at the second interface of the bonding layer in contact with the copper plate. Thus, the bonded substrate having higher adhesion between the copper plate and the bonding layer than the bonded substrate not having such distribution of nitrogen is achieved.

Thus, according to the present invention, the bonded substrate having a high bonding strength can be obtained.

It is therefore an object of the present invention to improve an adhesion strength between a silicon nitride ceramic substrate and a bonding layer and an adhesion strength between a copper plate and the bonding layer to obtain a bonded substrate having a high bonding strength.

BRIEF DESCRIPTION OF THE DRAWINGS

FIG. 1 is a cross-sectional view schematically showing a bonded substrate 1.

FIG. 2 is an enlarged cross-sectional view schematically showing a portion of the bonded substrate 1.

FIG. 4 is a flowchart showing a sequence in manufacturing the bonded substrate 1.

FIGS. 12A and 12B show enlarged views of portions of the STEM images in FIGS. 11A and 11B.

FIG. 15 shows an HAADF-STEM image showing four extraction positions P1, P2, P3, and P4 targeted for quantitative analysis based on results of measurement by EDX.

FIG. 18 shows a BF-STEM image showing five extraction positions P11, P12, P13, P14, and P15 targeted for measurement of a selected area electron diffraction pattern.

FIGS. 19A to 19D show a region targeted for measurement by electron energy loss spectroscopy (EELS) and EELS intensity maps showing distribution of elements in the region.

DESCRIPTION OF THE PREFERRED EMBODIMENTS

<Bonded Substrate>

Figure 3:
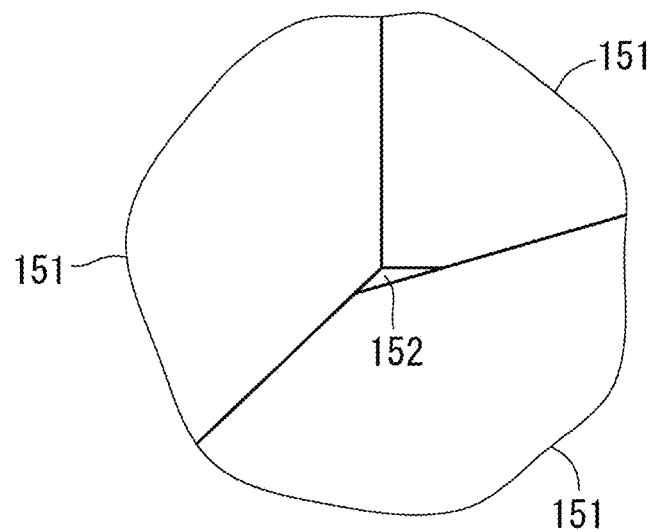
FIG. 3 schematically shows a microstructure of a bonding layer 13.

FIG. 1 is a cross-sectional view schematically showing a bonded substrate 1 according to an embodiment of the present invention.

As illustrated in FIG. 1, the bonded substrate 1 includes a silicon nitride ceramic substrate (hereinafter, a ceramic substrate) 11, a copper plate 12U, a bonding layer 13U, a copper plate 12L, and a bonding layer 13L. The bonded substrate 1 may include components other than these components. Placement of one of a pair of the copper plate 12U and the bonding layer 13U and a pair of the copper plate 12L and the bonding layer 13L may be omitted.

The copper plate 12U and the bonding layer 13U are disposed over a main surface 101U of the ceramic substrate 11. The copper plate 12L and the bonding layer 13L are disposed over a main surface 101L of the ceramic substrate 11.

The bonding layer 13U bonds the copper plate 12U to the main surface 101U of the ceramic substrate 11, and the bonding layer 13L bonds the copper plate 12L to the main surface 101L of the ceramic substrate 11.

The bonded substrate 1 may be used in any way, and is used, for example, as an insulating heat-dissipating substrate on which a power semiconductor device is mounted.

FIG. 2 is an enlarged cross-sectional view schematically showing a portion of the bonded substrate 1 according to the present embodiment.

A set of a main surface 101 of the ceramic substrate 11, a copper plate 12, and a bonding layer 13 illustrated in FIG. 2 corresponds to both of a set of the main surface 101U of the ceramic substrate 11, the copper plate 12U, and the bonding layer 13U, and a set of the main surface 101L of the ceramic substrate 11, the copper plate 12L, and the bonding layer 13L.

The copper plate 12 is brazed to the ceramic substrate 11 by active metal brazing. At brazing, an intermediate in which a brazing material layer formed of an active metal brazing material (hereinafter, simply a brazing material) is disposed between the ceramic substrate 11 and the copper plate 12 is heated under pressure to change the brazing material layer into the bonding layer 13. The brazing material is a material containing a powder of silver (Ag) and an active metal, and, at formation of the brazing material layer, a brazing material including a solvent and the like to be a paste is disposed. The bonding layer 13 thus contains silver and the active metal. The active metal is at least one metal selected from the group consisting of titanium (Ti) and zirconium (Zr).

While there is no particular limitation on the thickness of the ceramic substrate 11 and the thickness of the copper plate 12, the ceramic substrate 11 having a thickness of approximately 0.2 mm to 0.4 mm and the copper plate 12 having a thickness of approximately 0.3 mm to 1.2 mm are typically used.

On the other hand, the bonding layer 13 has a thickness corresponding to the thickness of the brazing material layer formed at brazing, and generally has a thickness of approximately a submicron to several microns.

The bonding layer 13 also contains nitrogen (N) and silicon (Si) supplied from the ceramic substrate 11 at brazing. At least part of nitrogen or silicon as supplied forms a compound with the active metal. The bonding layer 13 thus contains a nitride and a silicide of the active metal.

The bonding layer 13 further contains copper (Cu) supplied from the copper plate 12 at brazing. Copper forms a solid solution with a substance forming the bonding layer 13. The bonding layer 13 may contain copper contained in the brazing material and copper supplied from the copper plate 12.

On the other hand, a majority of silver contained in the brazing material layer is diffused into the copper plate 12 at formation of the bonding layer 13. Thus, silver forms a solid solution with at least a portion of the copper plate 12 near the bonding layer 13.

As illustrated in FIG. 2, the bonding layer 13 has a first interface 111 between the bonding layer 13 and the ceramic substrate 11 and a second interface 112 between the bonding layer 13 and the copper plate 12.

As illustrated in FIG. 2, the bonding layer 13 includes a first interface layer (a first-interface-side interface layer) 121, an intermediate layer 122, and a second interface layer (a second-interface-side interface layer) 123. The first interface layer 121 is present along the first interface 111. The second interface layer 123 is present along the second interface 112. The intermediate layer 122 is present away from the first interface 111 and the second interface 112, and is present between the first interface layer 121 and the second interface layer 123.

The first interface layer 121, the intermediate layer 122, and the second interface layer 123 are each formed of a polycrystalline substance.

As illustrated in FIG. 2, the bonding layer 13 further includes a nanoparticle layer 131.

The nanoparticle layer 131 is included in the first interface layer 121, and is present along the first interface 111.

The nanoparticle layer 131 includes a plurality of nanoparticles 141. The plurality of nanoparticles 141 each have a particle size of 50 nm or less. The nanoparticle layer 131 thus has a high surface tension. This contributes to improvement in adhesion strength between the ceramic substrate 11 and the bonding layer 13.

The nanoparticle layer 131 contains a greater atomic fraction of silver and copper than a portion of the first interface layer 121 other than the nanoparticle layer 131. Silver present in the nanoparticle layer 131 is that remaining in the bonding layer 13 without being diffused into the copper plate 12. In particular, the nanoparticles 141 contain more silver than a portion of the nanoparticle layer 131 around the nanoparticles 141. The nanoparticle layer 131 thus has a smaller Young's modulus than the other portion of the bonding layer 13. Due to the presence of the nanoparticle layer 131, stress caused in the first interface layer 121 is relieved in the bonded substrate 1.

FIG. 3 schematically shows a microstructure of the bonding layer 13.

As illustrated in FIG. 3, the bonding layer 13 includes a plurality of particles 151 and a different phase 152. The plurality of particles 151 form grain boundary triple points. The different phase 152 is present at the formed grain boundary triple point. The different phase 152 contains silver. Silver in the different phase 152 is also that remaining in the bonding layer 13 without being diffused into the copper plate 12. Due to the presence of the different phase 152 in the bonding layer 13, stress that may be caused in the bonding layer 13 is relieved by the different phase 152. Propagation of a crack in the bonding layer 13 is thereby prevented.

As illustrated in FIG. 2, the ceramic substrate 11 includes an oxygen containing layer 132. The oxygen containing layer 132 is present along the first interface 111.

<Relationship Between Element Distribution in Bonding Layer and Substrate Characteristics>

As described above, nitrogen and silicon contained in the ceramic substrate 11 and copper derived from the copper plate 12 are present in the bonding layer 13, in addition to the active metal (titanium and zirconium) contained in the brazing material. On the other hand, the majority of silver present in the brazing material is diffused into the copper plate 12.

In the bonded substrate 1 according to the present embodiment, distribution of concentrations (more specifically, distribution of atomic fractions along the thickness direction) of these elements is related to the presence of the first interface layer 121, the intermediate layer 122, and the second interface layer 123 in the bonding layer 13 and further to the presence of the nanoparticle layer 131 in the first interface layer 121. The distribution is by extension related to securement of the bonding strength between the ceramic substrate 11 and the copper plate 12 by the bonding layer 13 and the other substrate characteristics.

First, an atomic fraction (a concentration) of nitrogen derived from the ceramic substrate 11 of the bonding layer 13 is greatest at the first interface 111, decreases with increasing distance from the first interface 111 and with decreasing distance from the second interface 112, and is smallest at the second interface 112. An atomic fraction of nitrogen of the intermediate layer 122 is thus smaller than that of the first interface layer 121 and is greater than that of the second interface layer 123. The atomic fraction of nitrogen of the bonding layer 13 changes generally continuously along the thickness direction.

In contrast, an atomic fraction of silicon derived from the ceramic substrate 11 as with nitrogen of the bonding layer 13 is smallest at the first interface 111, and tends to increase with increasing distance from the first interface 111 and with decreasing distance from the second interface 112. The atomic fraction of silicon of the bonding layer 13 changes discontinuously at an interface between the first interface layer 121 and the intermediate layer 122 and at an interface between the intermediate layer 122 and the second interface layer 123.

Furthermore, as with silicon, an atomic fraction of the active metal of the bonding layer 13 is smallest at the first interface 111, and tends to increase with increasing distance from the first interface 111 and with decreasing distance from the second interface 112. The atomic fraction of the active metal of the bonding layer 13 changes generally continuously along the thickness direction.

As described above, in the bonding layer 13, the atomic fraction of nitrogen is greatest at the first interface 111 in contact with the ceramic substrate 11.

Nitrogen tends to form a stronger bond with silicon nitride ceramics than metallic elements. Thus, in the bonded substrate 1 according to the present embodiment in which the atomic fraction of nitrogen of the bonding layer 13 is greatest at the first interface 111, adhesion between the ceramic substrate 11 and the bonding layer 13 is higher than that in a bonded substrate not having such distribution of nitrogen.

On the other hand, the atomic fractions of silicon and the active metal are greatest at the second interface 112 in contact with the copper plate 12. In other words, the sum of the atomic fractions of silicon and the active metal is greatest at the second interface 112 in contact with the copper plate 12.

In terms of adhesion between the copper plate 12 and the bonding layer 13, it is preferable that a metallic bond between copper and the metallic elements be dominant over a bond between copper and nitrogen. Thus, in the bonded substrate 1 according to the present embodiment in which the atomic fractions of the active metal and silicon of the bonding layer 13 are greatest at the second interface 112, adhesion between the copper plate 12 and the bonding layer 13 is higher than that in a bonded substrate not having such distribution of the active metal and silicon.

As a result, in the bonded substrate 1 according to the present embodiment, both adhesion between the ceramic substrate 11 and the bonding layer 13 and adhesion between the copper plate 12 and the bonding layer 13 are enhanced.

In general, the first interface layer 121 contains the nitride of the active metal as a major component, the second interface layer 123 contains the silicide of the active metal as a major component, and the intermediate layer 122 contains, as a major component, a solid solution of silicon and the nitride of the active metal.

In a case where the active metal includes titanium, the nitride of the active metal includes titanium nitride having a composition represented by a formula $TiN_x$. In this case, the first interface layer 121 contains the titanium nitride as a major component.

In a case where the active metal includes titanium, the silicide of the active metal includes titanium silicide having a composition represented by a formula $Ti_5Si_3$. In this case, the second interface layer 123 contains the titanium silicide as a major component.

In a case where the active metal includes titanium, the intermediate layer 122 contains, as a major component, a solid solution of silicon and titanium nitride having the composition represented by the formula $TiN_x$.

Next, an atomic fraction of copper of the bonding layer 13 is greatest in the intermediate layer 122, and is smaller at the first interface 111 and at the second interface 112 than in the intermediate layer 122. The intermediate layer 122 thus has a smaller Young's modulus than the first interface layer 121 and the second interface layer 123, and is therefore more likely to relieve stress than these layers. The atomic fraction of copper of the bonding layer 13 changes discontinuously at the interface between the first interface layer 121 and the intermediate layer 122 and at the interface between the intermediate layer 122 and the second interface layer 123.

An atomic fraction of copper of the intermediate layer 122 is preferably 1 at. % or more and 10 at. % or less. When the atomic fraction of copper of the intermediate layer 122 is less than 1 at. %, the relief of stress caused in the intermediate layer 122 tends to be difficult. When the atomic fraction of copper of the intermediate layer 122 is more than 10 at. %, copper forming a solid solution with the intermediate layer 122 tends to be soluble at etching, which will be described below, to form a depletion layer in the intermediate layer 122.

On the other hand, as described above, the majority of silver present in the brazing material is diffused into the copper plate 12 by heating under pressure for brazing, but part of silver remains in the bonding layer 13 in the form of the nanoparticle layer 131 including the plurality of nanoparticles 141 and the different phase 152 formed at a three-phase interface. At these positions, silver remains locally and finely, and thus these positions have the stress relieving effect in common.

In contrast to the bonded substrate disclosed in Japanese Unexamined Patent Application Publication No. 2018-506496, no void and Ag-rich phase is formed at the interface between the copper plate 12 and the bonding layer 13 in the bonded substrate 1 according to the present embodiment. This is also preferable in terms of improvement in adhesion between the copper plate 12 and the bonding layer 13.

<Method for Manufacturing Bonded Substrate>

In the present embodiment, various elements are present to have distribution of the atomic fractions as described above so that both adhesion between the ceramic substrate 11 and the bonding layer 13 and adhesion between the copper plate 12 and the bonding layer 13 are improved, and the distribution of the atomic fractions is achieved when a silver powder having predetermined particle size distribution is selected as the silver power contained in the brazing material for use in formation of a brazing layer at the manufacture of the bonded substrate 1. This point will be described below while procedures for manufacturing the bonded substrate 1 are shown.

Figure 5:
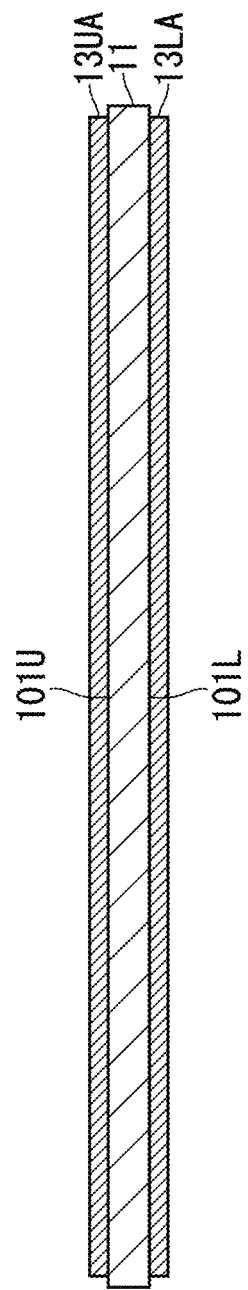
FIG. 5 is a cross-sectional view schematically showing an intermediate product obtained in the process of manufacturing the bonded substrate 1.
Figure 6:
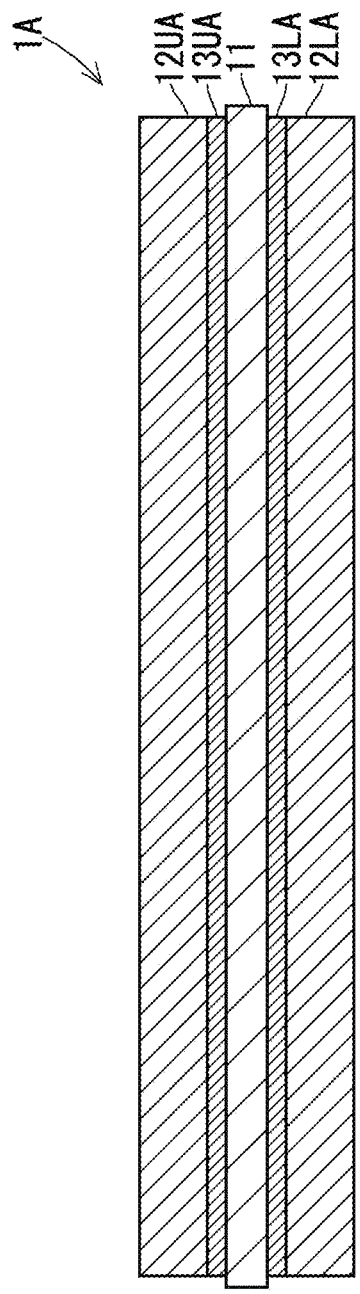
FIG. 6 is a cross-sectional view schematically showing an intermediate product obtained in the process of manufacturing the bonded substrate 1.
Figure 7:
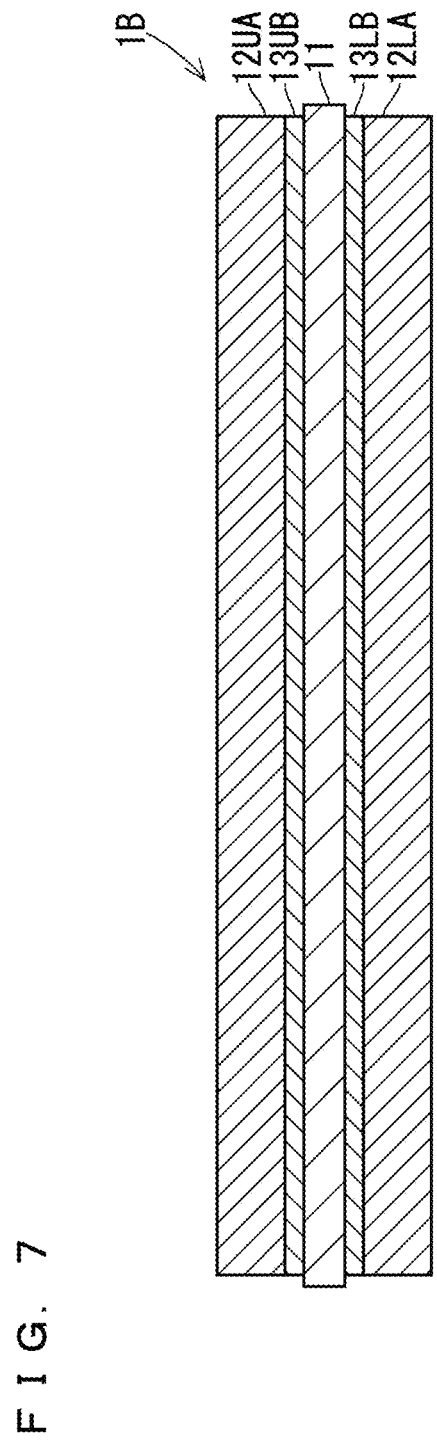
FIG. 7 is a cross-sectional view schematically showing an intermediate product obtained in the process of manufacturing the bonded substrate 1.

FIG. 4 is a flowchart showing a sequence in manufacturing the bonded substrate 1 according to the present embodiment. FIGS. 5, 6, and 7 are cross-sectional views schematically showing intermediate products obtained in the process of manufacturing the bonded substrate 1. As described above, placement of one of the pair of the copper plate 12U and the bonding layer 13U and the pair of the copper plate 12L and the bonding layer 13L may be omitted. In this case, processing targeted for a portion whose placement is omitted is omitted as appropriate in the procedures shown below.

In the manufacture of the bonded substrate 1 according to the present embodiment, steps S101 to S104 shown in FIG. 4 are sequentially performed.

In step S101, brazing material layers 13UA and 13LA are formed respectively on the main surfaces 101U and 101L of the ceramic substrate 11 as illustrated in FIG. 5.

When the brazing material layers 13UA and 13LA are formed, a paste containing a brazing material and a solvent is prepared. The paste may further contain a binder, a dispersant, an antifoaming agent, and the like. The prepared paste is then screen printed on the main surfaces 101U and 101L of the ceramic substrate 11 to form first and second screen printed films respectively on the main surfaces 101U and 101L of the ceramic substrate 11. An organic component, such as the solvent, contained in the formed first and second screen printed films is then volatilized. The first and second screen printed films are thereby respectively changed into the brazing material layers 13UA and 13LA. The brazing material layers 13UA and 13LA may be formed by a method different from this method.

The brazing material contains a metal powder and a powder of a hydride of the active metal. The metal powder contains silver. The metal powder may contain a metal other than silver. The metal powder may contain copper (Cu), indium (In), and tin (Sn), for example.

The brazing material is preferably formed of a powder having an average particle size of 0.1 μm or more and 10 μm or less. Use of a powder having such an average particle size for the brazing material enables the brazing material layers 13UA and 13LA to each have a small thickness. The average particle size can be obtained by calculating D50 (a median diameter) from particle size distribution. In the present embodiment, particle size distribution of various powders is measured using a commercially available laser diffraction particle size distribution analyzer.

The brazing material layers 13UA and 13LA each preferably have a thickness of 0.1 μm or more and 10 μm or less, and more preferably have a thickness of 0.1 μm or more and 5 μm or less.

In particular, as the silver power contained in the brazing material, a silver powder having D50 in a range of 0.5 μm to 1.5 μm and D95 in a range of 2.0 μm to 3.5 μm in the particle size distribution is used. The particle size distribution of the silver powder satisfying these ranges is hereinafter referred to as prescribed particle size distribution.

The brazing material preferably contains 40 wt % or more and 80 wt % or less of silver.

In step S102, copper plates 12UA and 12LA are disposed respectively on the formed brazing material layers 13UA and 13LA as illustrated in FIG. 6. An intermediate product 1A including the ceramic substrate 11, the brazing material layer 13UA, the copper plate 12UA, the brazing material layer 13LA, and the copper plate 12LA is thereby obtained.

In step S103, the obtained intermediate product 1A is heated under pressure. The brazing material layers 13UA and 13LA are thereby respectively changed into bonding layers 13UB and 13LB illustrated in FIG. 7, and an intermediate product 1B including the ceramic substrate 11, the bonding layer 13UB, the copper plate 12UA, the bonding layer 13LB, and the copper plate 12LA is obtained. The bonding layers 13UB and 13LB respectively bond the copper plates 12UA and 12LA to the ceramic substrate 11.

More particularly, during heating under pressure of the intermediate product 1A, copper contained in the copper plate 12 (the copper plates 12UA and 12LA) is supplied to the brazing material layers 13UA and 13LA, and is diffused into the brazing material layers 13UA and 13LA on a side of the second interface 112 (FIG. 2). Furthermore, silver contained in the brazing material layers 13UA and 13LA is diffused into the copper plate 12 sequentially from the proximity of the second interface 112. Thus, in each of the brazing material layers 13UA and 13LA, concentration gradients are formed so that, with decreasing distance from the second interface 112, an atomic fraction of silver decreases, and the atomic fraction of the active metal increases. Due to formation of a concentration gradient of the former, diffusion of silver further progresses. The majority of silver present in the brazing material layers 13UA and 13LA is eventually diffused into the copper plate 12. In the bonding layer 13 (the bonding layers 13UB and 13LB) changed from the brazing material layers 13UA and 13LA, silver remains almost only near the first interface 111 (FIG. 2) and in the different phase 152.

On the other hand, mainly on a side of the first interface 111 close to the ceramic substrate 11, nitrogen and silicon contained in the ceramic substrate 11 is supplied to the brazing material layers 13UA and 13LA, and is diffused into the brazing material layers 13UA and 13LA.

Nitrogen, however, reacts with the active metal contained in the brazing material layers 13UA and 13LA to form the nitride of the active metal. The nitride of the active metal grows sequentially from a side of the ceramic substrate 11 (from a side of the first interface 111) along the thickness direction. In this case, near the first interface 111, the plurality of nanoparticles 141 containing a large amount of silver remaining without being diffused into the copper plate 12 are formed in the nitride of the active metal. The nanoparticle layer 131 is thereby formed.

In contrast, silicon, which has a higher diffusion rate than nitrogen, is more significantly diffused toward the second interface 112 than nitrogen. Furthermore, silicon reacts with the active metal having a greater atomic fraction on the side of the second interface 112 to generate the silicide of the active metal.

When heating under pressure eventually ends, and the brazing material layers 13UA and 13LA are respectively changed into the bonding layers 13UB and 13LB illustrated in FIG. 7, the above-mentioned distribution of the atomic fractions of various elements is achieved in each of the bonding layers 13UB and 13LB.

The distribution of the atomic fractions is suitably achieved in a case where the silver powder contained in the brazing material fulfills the above-mentioned prescribed particle size distribution.

For example, in a case where the particle size distribution of the silver powder is shifted to a side of a large size compared with the prescribed particle size distribution, in other words, at least one of D50 and D95 is greater than an allowable range in the prescribed particle size distribution, a ratio of silver particles each having a large particle size (i.e., volume) is greater in each of the brazing material layers 13UA and 13LA. Thus, diffusion of silver into the copper plate 12 does not sufficiently progress at heating under pressure, and a large amount of silver remains in the bonding layer 13 (the bonding layers 13UB and 13LB). In this case, due to silver remaining in the bonding layer 13, diffusion of nitrogen and silicon from the ceramic substrate 11 and further reaction of the active metal and silicon near the second interface 112 and reaction of nitrogen and the active metal near the first interface 111 remain insufficient. Furthermore, the nanoparticle layer 131 including the plurality of nanoparticles 141 is not formed. As a result, distribution of the atomic fractions leading to improvement in bonding strength cannot be obtained, which is not preferable.

On the other hand, in a case where the particle size distribution of the silver powder is shifted to a side of a small size compared with the prescribed particle size distribution, in other words, at least one of D50 and D95 is smaller than the allowable range in the prescribed particle size distribution, diffusion of silver into the copper plate 12 rapidly progresses, so that a concentration gradient as described above is not formed, the majority of silver in the brazing material layers 13UA and 13LA is diffused into the copper plate 12, and little silver remains near the first interface 111. The atomic fraction of the active metal is thus greater on the side of the first interface 111, and silicon supplied from the ceramic substrate 11 is likely to react with the active metal without heading toward the proximity of the second interface 112. Furthermore, the nanoparticles 141 are not formed. In this case, distribution of the atomic fractions leading to improvement in bonding strength cannot be obtained, which is not preferable.

Heating under pressure of the intermediate product 1A is preferably hot pressing. When the intermediate product 1A is hot pressed, the intermediate product 1A is preferably heated in a vacuum or an inert gas in accordance with a temperature profile having a maximum temperature of 800° C. or more and 900° C. or less, and pressurized along the thickness direction of the ceramic substrate 11 in accordance with a contact pressure profile having a maximum contact pressure of 5 MPa or more and 25 MPa or less. The copper plates 12UA and 12LA can thereby be bonded to the ceramic substrate 11 without forming any void at the first interface 111 and the second interface 112 even when the brazing material layers 13UA and 13LA each have a small thickness of 0.1 μm or more and 10 μm or less.

In step S104, the bonding layer 13UB, the copper plate 12UA, the bonding layer 13LB, and the copper plate 12LA are patterned. The bonding layers 13UB and 13LB are thereby respectively changed into the patterned bonding layers 13U and 13L illustrated in FIG. 1. The copper plates 12UA and 12LA are respectively changed into the patterned copper plates 12U and 12L illustrated in FIG. 1.

Figure 8:
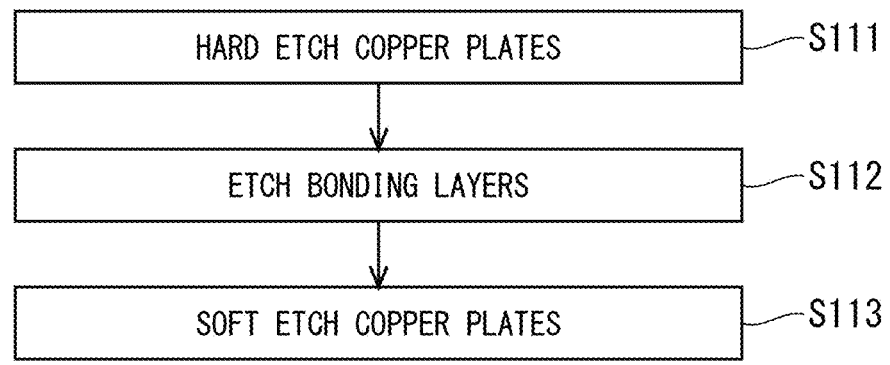
FIG. 8 is a flowchart showing a sequence in patterning bonding layers and copper plates in the manufacture of the bonded substrate 1.
Figure 9:
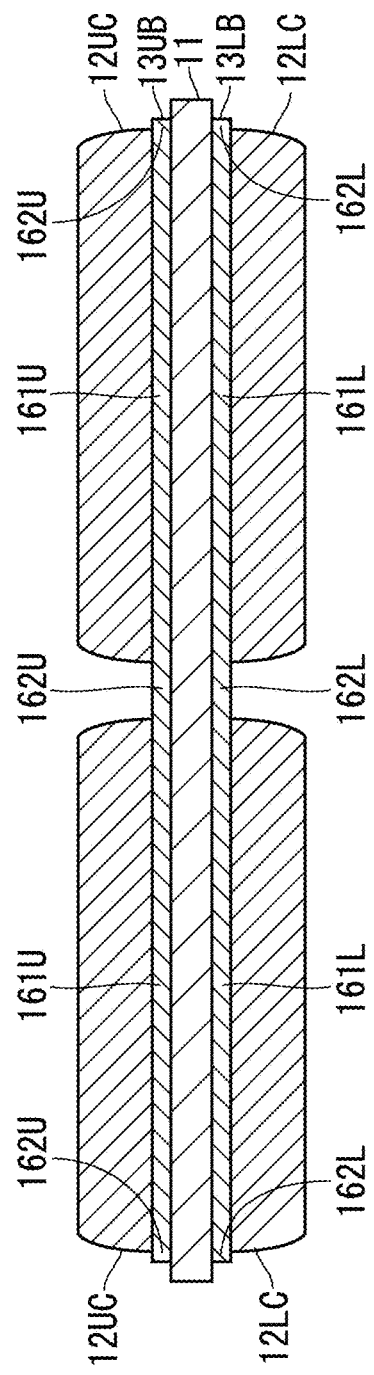
FIG. 9 is a cross-sectional view schematically showing an intermediate product obtained in the process of patterning a bonding layer 13 and a copper plate 12.
Figure 10:
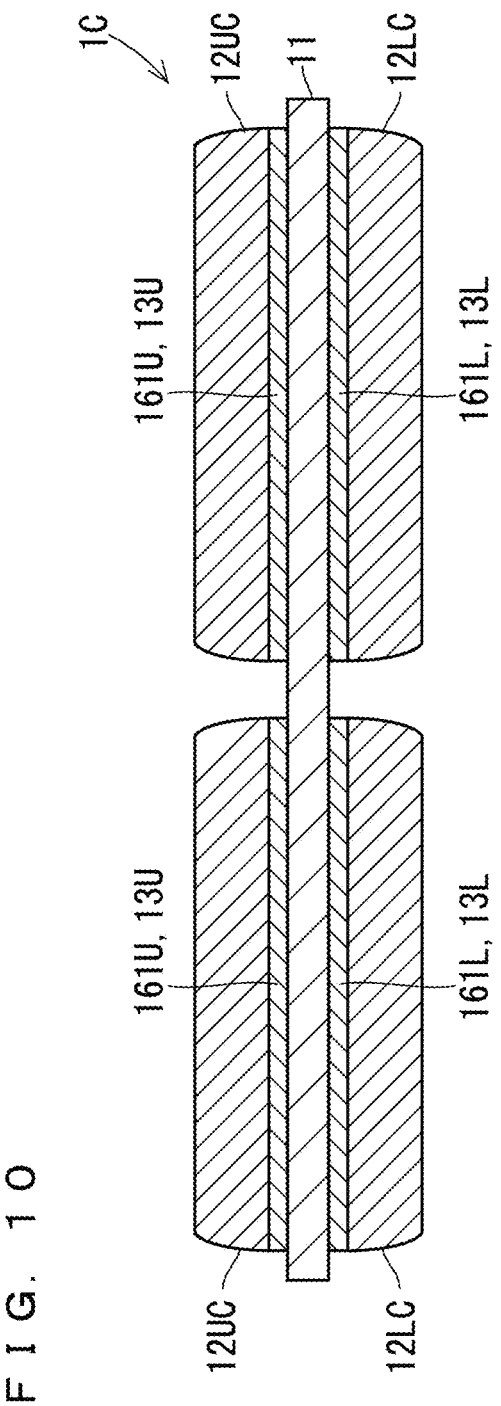
FIG. 10 is a cross-sectional view schematically showing an intermediate product obtained in the process of patterning the bonding layer 13 and the copper plate 12.

FIG. 8 is a flowchart showing a sequence in patterning the bonding layers and the copper plates in the manufacture of the bonded substrate 1 according to the present embodiment. FIGS. 9 and 10 are cross-sectional views schematically showing intermediate products obtained in the process of patterning the bonding layer 13 and the copper plate 12.

In patterning the bonding layer 13UB, the copper plate 12UA, the bonding layer 13LB, and the copper plate 12LA, steps S111 to S113 shown in FIG. 8 are sequentially performed.

In step S111, the copper plates 12UA and 12LA are hard etched. Thereby, parts of the copper plates 12UA and 12LA are removed, so that the copper plates 12UA and 12LA are changed into copper plates 12UC and 12LC, respectively, as illustrated in FIG. 9. Concurrently, in the bonding layer 13UB, a first portion 161U positioning between the ceramic substrate 11 and the etched copper plate 12UC and a second portion 162U positioning except between the ceramic substrate 11 and the etched copper plate 12UC are formed. Similarly, in the bonding layer 13LB, a first portion 161L positioning between the ceramic substrate 11 and the etched copper plate 12LC and a second portion 162L positioning except between the ceramic substrate 11 and the etched copper plate 12LC are formed. An etchant such as an iron chloride aqueous solution and a copper chloride aqueous solution can be used for hard etching of the copper plates 12UA and 12LA.

In step S112, the second portions 162U and 162L of the bonding layers 13UB and 13LB are etched. Thereby, the second portions 162U and 162L are removed, and the first portions 161U and 161L remain as illustrated in FIG. 10. The remaining first portions 161U and 161L correspond to the bonding layers 13U and 13L of the bonded substrate 1 as illustrated in FIG. 1, respectively. An intermediate product 1C including the ceramic substrate 11, the bonding layer 13U, the copper plate 12UC, the bonding layer 13L, and the copper plate 12LC is thereby obtained. An etchant such as an ammonium fluoride aqueous solution can be used for etching of the second portions 162U and 162L.

In step S113, the etched copper plates 12UC and 12LC are further soft etched. The end portions of the etched copper plates 12UC and 12LC are thereby removed, so that the patterned copper plates 12U and 12L illustrated in FIG. 1 are obtained. In the bonding layer 13U, an interplate portion 171U interposed between the ceramic substrate 11 and the copper plate 12U and protruding portions 172U protruding from between the ceramic substrate 11 and the copper plate 12U are formed as illustrated in FIG. 1. Similarly, in the bonding layer 13L, an interplate portion 171L interposed between the ceramic substrate 11 and the copper plate 12L and protruding portions 172L protruding from between the ceramic substrate 11 and the copper plate 12L are formed. The etchant such as the iron chloride aqueous solution and the copper chloride aqueous solution can be used for soft etching of the copper plates 12UC and 12LC.

EXAMPLES

Example 1

In this example, the bonded substrate 1 was manufactured in accordance with the above-mentioned manufacturing method. Titanium was selected as the active metal. A ceramic substrate having a thickness of 0.32 mm was prepared as the ceramic substrate 11, and a copper plate having a thickness of 0.8 mm was prepared as the copper plate 12. As the brazing material, a brazing material containing 40 wt % titanium and 60 wt % silver was used. As the silver powder, a silver powder having D50 of 1.0 μm and D95 of 2.5 μm was used. The brazing material layers were each formed to have a thickness of 4 μm. As heating under pressure to form the bonding layer 13, hot pressing was performed in a vacuum in accordance with a temperature profile having a maximum temperature of 830° C. and a contact pressure profile having a maximum contact pressure of 15 MPa.

Focused ion beam (FIB) machining and the like were performed on the manufactured bonded substrate 1 to manufacture an analytical sample, and cross-sectional observation and analysis of the bonded substrate 1 were conducted on the sample.

Figure 11B:
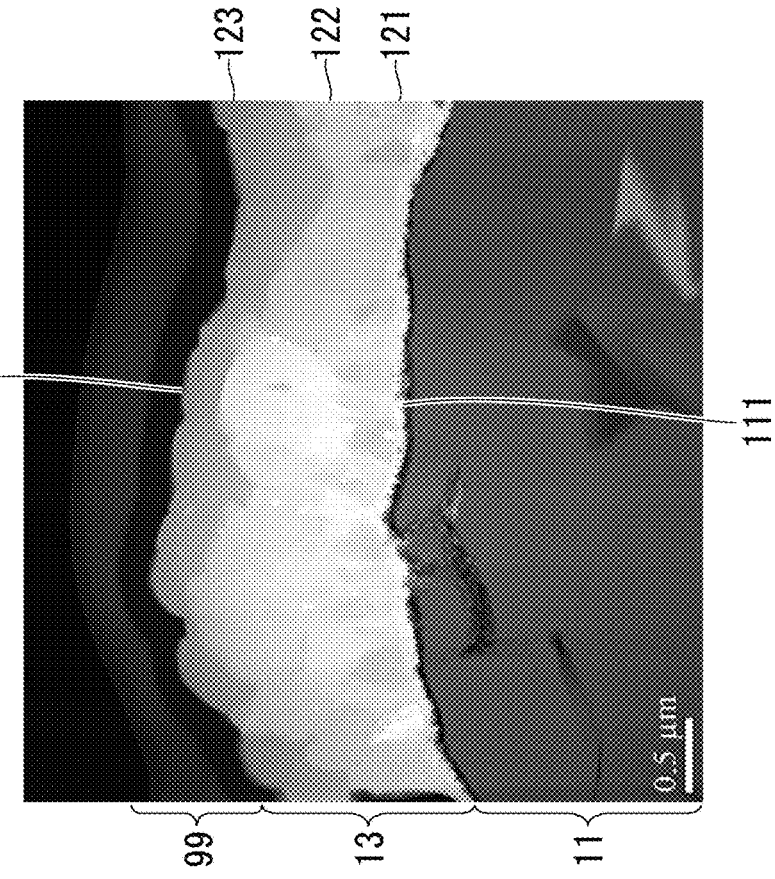
FIGS. 11A and 11B show STEM images used for observation of an analytical sample in Example 1.
Figure 11A:
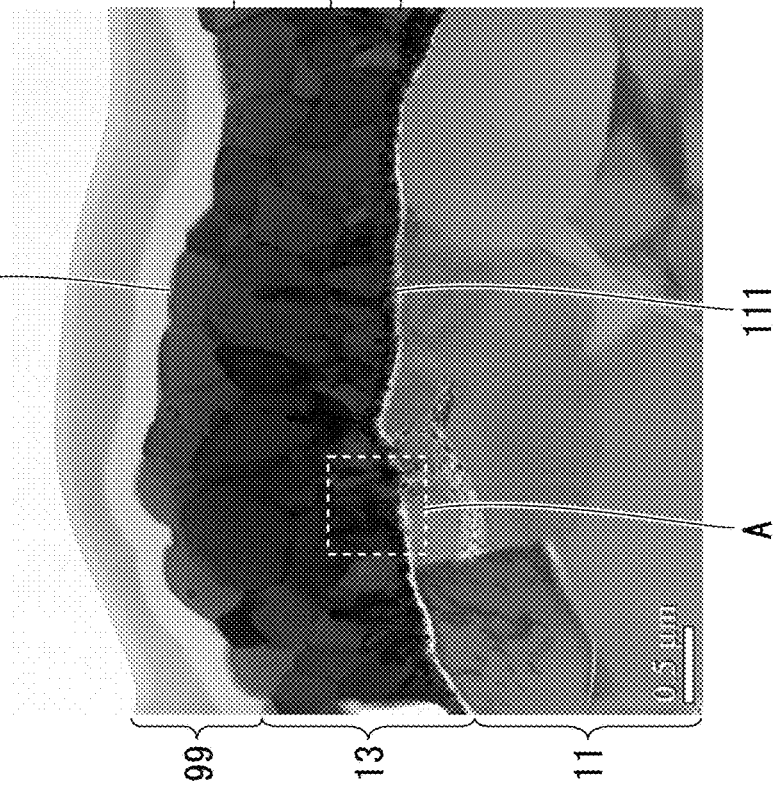

The manufactured analytical sample was observed under a scanning transmission electron microscope (STEM). FIGS. 11A and 11B show STEM images used for observation, and FIGS. 12A and 12B show enlarged views of portions of the STEM images. FIGS. 11A and 12A are bright-field (BF)-STEM images, and FIGS. 11B and 12B are high angle annular dark-field (HAADF)-STEM images in the same field of view as the corresponding BF-STEM images. FIGS. 12A and 12B are images at and near the first interface 111 in a portion A shown in FIG. 11A.

More particularly, FIGS. 11A, 11B, 12A and 12B each show images of a portion where each of the protruding portions 172U of the bonding layer 13 and the ceramic substrate 11 are bonded to each other without a bond between the copper plate 12 and the bonding layer 13, and a layer 99 in each of the BF-STEM image shown in FIG. 11A and the HAADF-STEM image shown in FIG. 11B is a layer of a protective film for FIB machining.

It can be seen from the BF-STEM image in FIG. 11A and the HAADF-STEM image in FIG. 11B that the first interface layer 121, the intermediate layer 122, and the second interface layer 123 constituting the bonding layer 13 are each formed of the polycrystalline material.

For confirmation, the copper plate 12 is not included in the field of view of each of STEM images in FIGS. 11A and 11B and subsequent figures, and thus the second interface 112 as an interface between the copper plate 12 and the interplate portion 171U of the bonding layer 13 (13U) is also not included, but the protruding portions 172U contiguous with the interplate portion 171U are considered to have substantially the same properties as the interplate portion 171U, so that it can be safely said that the first interface layer 121, the intermediate layer 122, and the second interface layer 123 are present in the bonding layer 13 included in the field of view of each of the STEM images in FIGS. 11A and 11B, and the like.

The first interface 111 is clearly seen from each of the enlarged views shown in FIGS. 12A and 12B due to a difference in contrast. In addition, it is confirmed from the latter that nanosized particles (nanoparticles) significantly brighter than the surroundings are dotted in a range within approximately 100 nm from the first interface 111. In other words, it is confirmed that the nanoparticle layer 131 including the plurality of nanoparticles 141 is present along the first interface 111 in the bonding layer 13.

Furthermore, energy dispersive X-ray analysis (EDX) was conducted in the field of view of the STEM images shown in FIGS. 11A and 11B to obtain mapping images of intensity of characteristic X-rays of carbon (C), nitrogen (N), oxygen (O), silicon (Si), titanium (Ti), copper (Cu), and silver (Ag). FIGS. 13A to 13G show results of mapping of the respective elements. FIGS. 14A to 14G show enlarged views of portions of the mapping images shown in FIGS. 13A to 13G in the same field of view as the enlarged views of the portions of the STEM images shown in FIGS. 12A and 12B. Specifically, FIGS. 13A, 13B, 13C, 13D, 13E, 13F, and 13G respectively show the mapping images of carbon, nitrogen, oxygen, silicon, titanium, copper, and silver. FIGS. 14A, 14B, 14C, 14D, 14E, 14F, and 14G show the enlarged views of the portions of the respective mapping images.

Figure 13C:
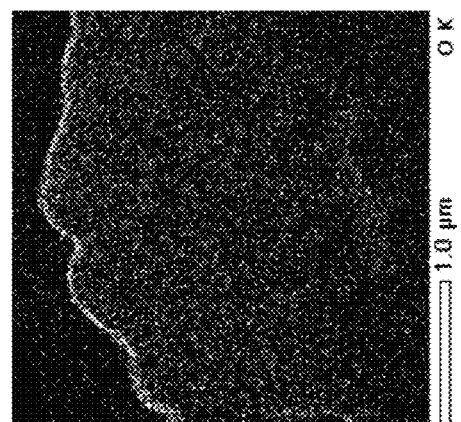
FIGS. 13A to 13G show results of mapping of oxygen, silicon, titanium, copper, and silver by energy dispersive X-ray analysis (EDX).
Figure 13B:
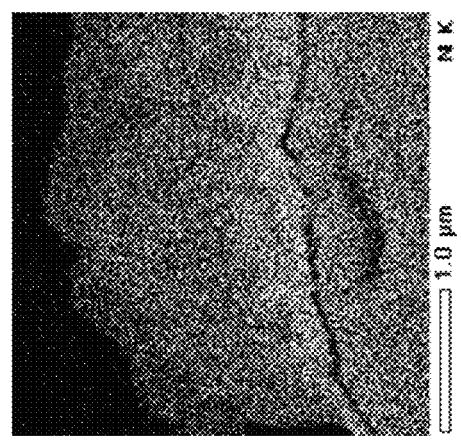
Figure 13A:
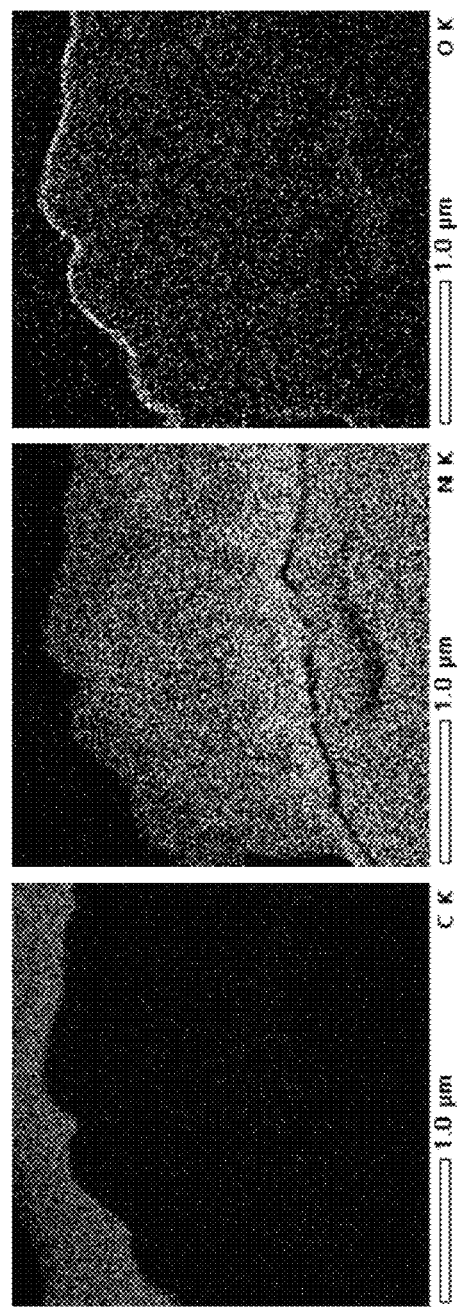

Taken the BF-STEM image shown in FIG. 11A, the HAADF-STEM image shown in FIG. 11B, and the mapping image of the intensity of the characteristic X-ray of nitrogen shown in FIG. 13B together, it is confirmed that nitrogen is present in the bonding layer 13.

Figure 13G:
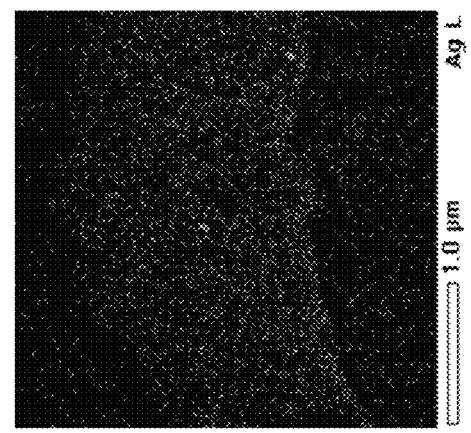
Figure 13F:
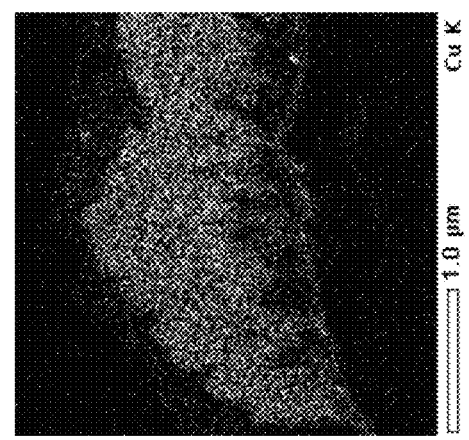
Figure 13E:
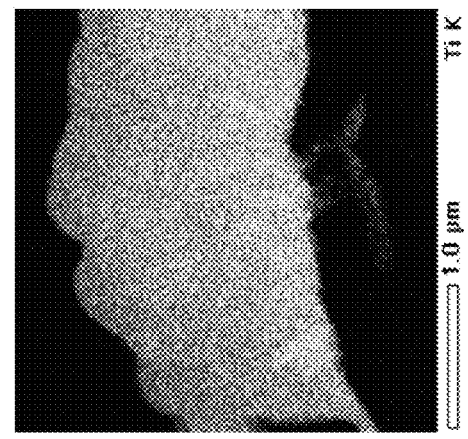

Taken the BF-STEM image shown in FIG. 11A, the HAADF-STEM image shown in FIG. 11B, and the mapping image of the intensity of the characteristic X-ray of titanium shown in FIG. 13E together, it is confirmed that titanium is present in the bonding layer 13.

Figure 13D:
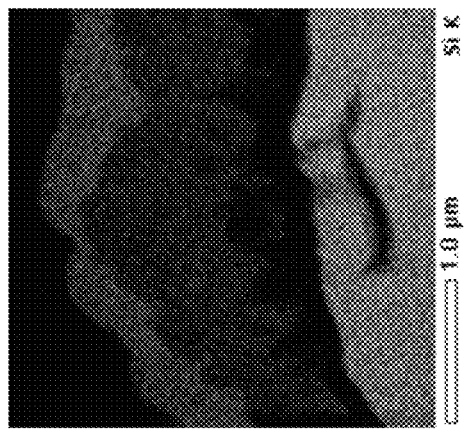

Taken the BF-STEM image shown in FIG. 11A, the HAADF-STEM image shown in FIG. 11B, and the mapping image of the intensity of the characteristic X-ray of silicon shown in FIG. 13D together, it is confirmed that silicon is present in the bonding layer 13.

Taken the BF-STEM image shown in FIG. 11A, the HAADF-STEM image shown in FIG. 11B, and the mapping image of the intensity of the characteristic X-ray of copper shown in FIG. 13F together, it is confirmed that copper is present in the bonding layer 13.

Figure 14C:
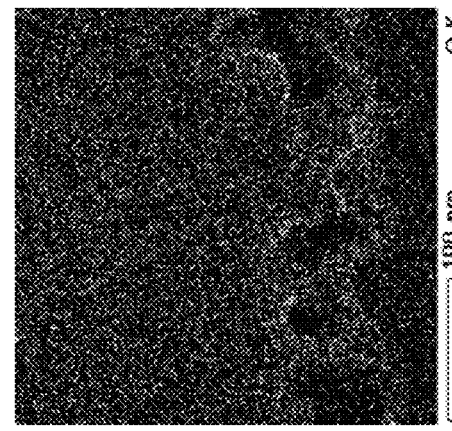
FIGS. 14A to 14G show enlarged views of portions of mapping images shown in FIGS. 13A to 13G in the same field of view as the enlarged views of the portions of the STEM images shown in FIGS. 12A and 12B.
Figure 14B:
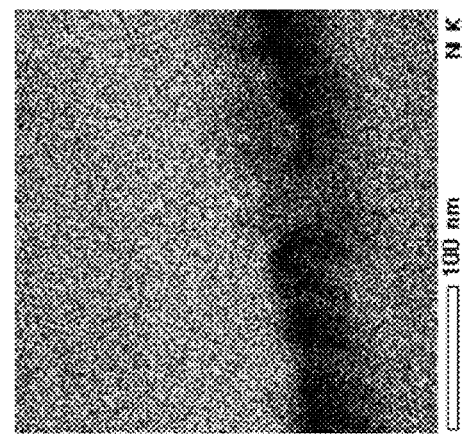
Figure 14A:
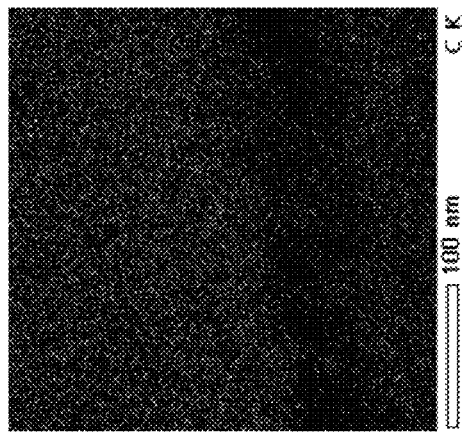
Figure 14G:
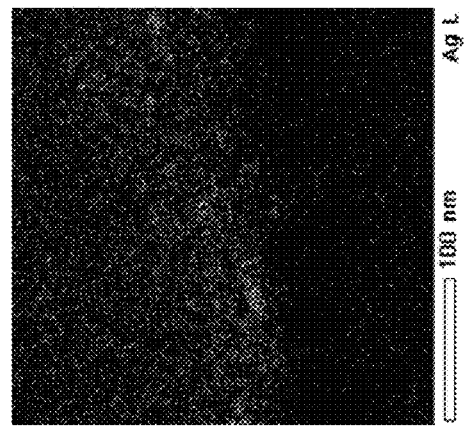
Figure 14F:
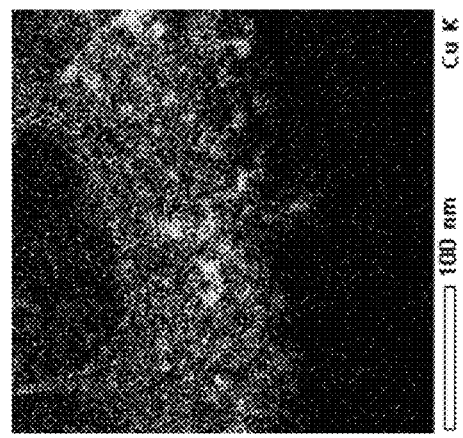
Figure 14E:
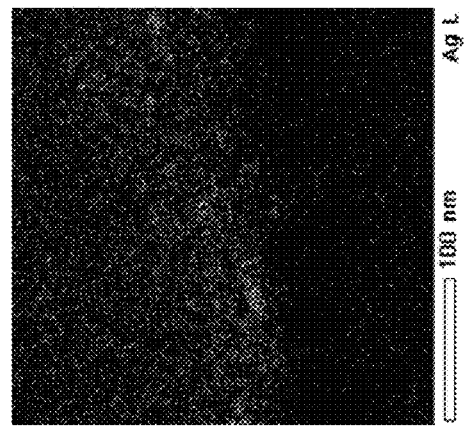
Figure 14D:
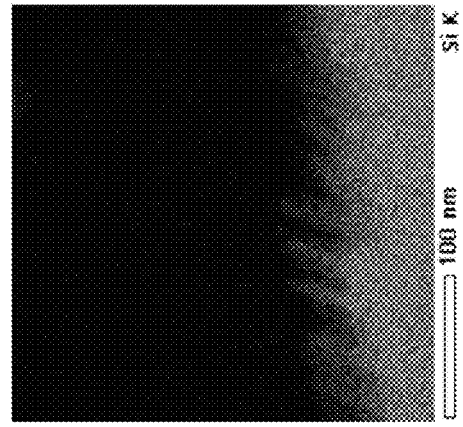

Taken the enlarged view of the portion of the HAADF-STEM image shown in FIG. 12B, the mapping images of the intensity of the characteristic X-ray of silver shown in FIGS. 13G and 14G, the mapping images of the intensity of the characteristic X-ray of copper shown in FIGS. 13F and 14F, and characteristics of HAADF-STEM images in that a heavier element having a greater atomic number is viewed to be brighter together, it is determined that the nanoparticle layer 131 contains more silver and copper than the other portion of the first interface layer 121, and the nanoparticles 141 contain more silver than a portion of the nanoparticle layer 131 around the nanoparticles 141.

Taken the enlarged view of the portion of the BF-STEM image shown in FIG. 12A, the enlarged view of the portion of the HAADF-STEM image shown in FIG. 12B, and the mapping image of the intensity of the characteristic X-ray of oxygen shown in FIG. 14C together, it is determined that the oxygen containing layer 132 is present along the first interface 111 in the ceramic substrate 11.

While it is confirmed, from the mapping image of the intensity of the characteristic X-ray of oxygen shown in FIG. 13C, that a large amount of oxygen is distributed at an interface between the bonding layer 13 and the protective film 99, this is because of exposure of each of the protruding portions 172U of the bonding layer 13 to air at the manufacture of the sample.

Furthermore, four different positions were extracted from a range of the bonding layer 13 included in the field of view of each of the STEM images shown in FIGS. 11A and 11B, and quantitative analysis based on results of measurement by EDX was conducted. FIG. 15 shows an HAADF-STEM image in a range of a portion of the field of view of each of the STEM images shown in FIGS. 11A and 11B showing the four extracted positions P1, P2, P3, and P4. The extracted positions P1, P2, P3, and P4 are respectively selected from the second interface layer 123, the intermediate layer 122, the first interface layer 121, and the nanoparticle layer 131. Concentrations (atomic fractions) of nitrogen, oxygen, silicon, titanium, copper, and silver at each of the extracted positions P1, P2, P3, and P4 are shown in Table 1.

TABLE 1

| | N | O | Si | Ti | Cu | Ag |
|---|---|---|---|---|---|---|
| EXTRACTED POSITION P1 (INTERFACE LAYER 123) | 11.95 | 2.12 | 32.48 | 52.46 | 0.98 | 0.01 |
| EXTRACTED POSITION P2 (INTERMEDIATE LAYER 122) | 37.63 | 0.30 | 10.27 | 46.39 | 5.40 | 0.02 |
| EXTRACTED POSITION P3 (INTERFACE LAYER 121) | 59.07 | | 0.15 | 40.42 | 0.34 | 0.04 |
| EXTRACTED POSITION P4 (NANOPARTICLE LAYER 131) | 64.77 | | 0.39 | 32.84 | 1.68 | 0.32 |

It is confirmed from Table 1 that the atomic fraction of nitrogen in the bonding layer 13 tends to increase with decreasing distance from the first interface 111, and decrease with decreasing distance from the second interface 112. It is also confirmed that the atomic fraction of silicon and the atomic fraction of titanium in the bonding layer 13 tend to decrease with decreasing distance from the first interface 111, and increase with decreasing distance from the second interface 112. In addition, it is confirmed that silver, which is present only in a small amount in a majority of the bonding layer 13, is unevenly distributed in the nanoparticle layer 131 including the plurality of nanoparticles 141 compared to the other portion of the bonding layer 13, and the atomic fraction of copper is greatest in the intermediate layer 122 while copper is present in the nanoparticle layer 131 as with silver.

For confirmation, it is seen, from the mapping image of titanium shown in FIG. 13E, that the concentration of titanium increases with decreasing distance from the first interface 111, and decreases with decreasing distance from the second interface 112, and thus the atomic fraction of titanium seems to be greater at the former. However, this is just because of a greater atomic density on the side of the first interface 111 than on the side of the second interface 112. The atomic fraction actually tends to decrease with decreasing distance from the first interface 111, and increase with decreasing distance from the second interface 112 as seen from numerical values shown in Table 1.

Comparing the extracted position P1 and the extracted position P3 in FIG. 15, it is seen that the former is slightly darker, whereas the atomic fractions of heavy elements tend to be greater at the extracted position P1 than at the extracted position P3 in Table 1. This is also because of a greater atomic density at the extracted position P3 on the side of the first interface 111.

Figure 16:
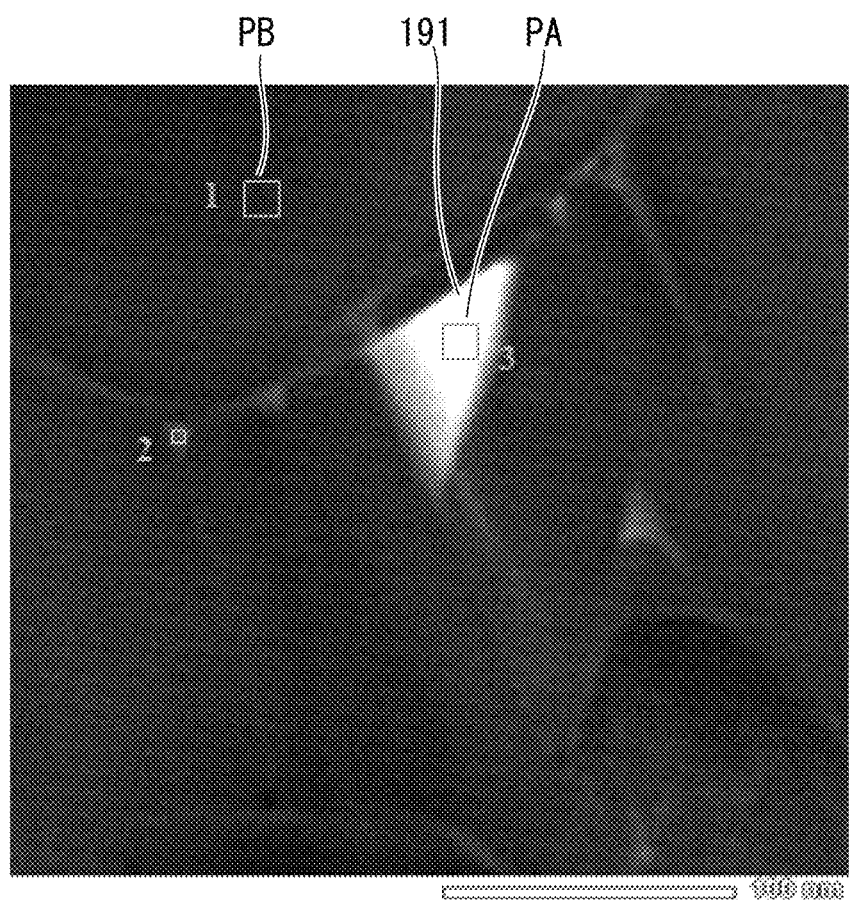
FIG. 16 shows an enlarged view of a portion of the HAADF-STEM image at and near a grain boundary triple point 191.
Figure 17A:
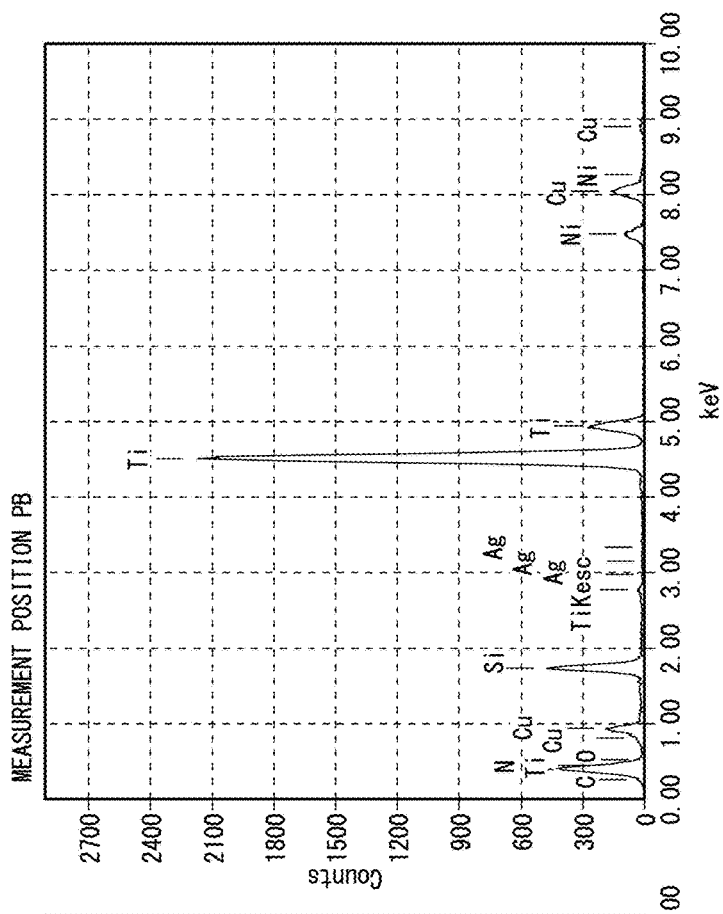
FIGS. 17A and 17B show EDX spectra at and near the grain boundary triple point 191.
Figure 17B:
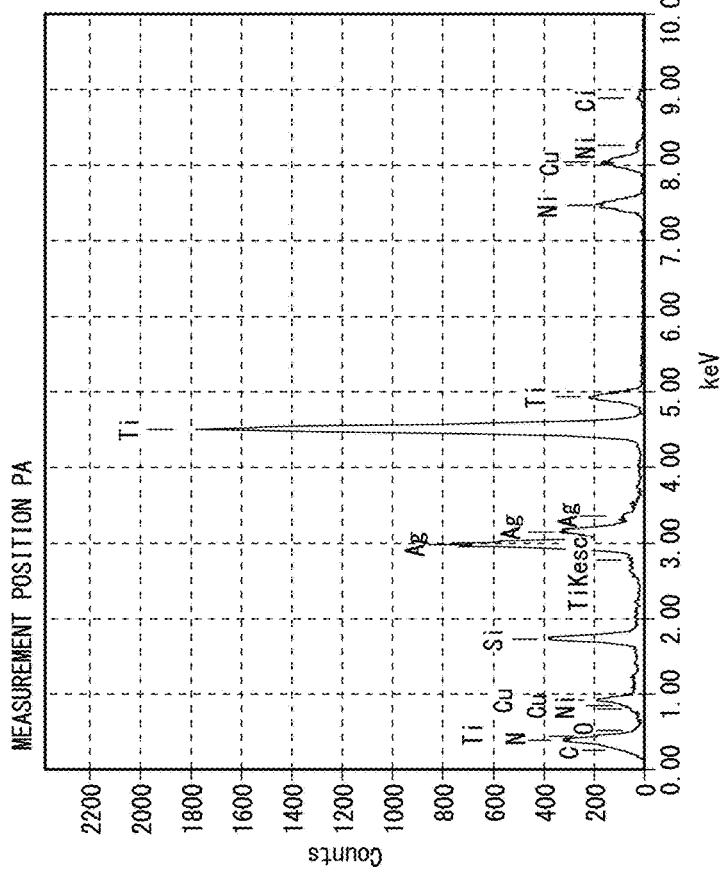

A grain boundary triple point 191 is seen in the HAADF-STEM image shown in FIG. 15. FIG. 16 shows an enlarged view of a portion of the HAADF-STEM image at and near the grain boundary triple point 191. FIGS. 17A and 17B show EDX spectra at and near the grain boundary triple point 191. FIG. 17A shows an EDX spectrum at a measurement position PA within the grain boundary triple point 191 shown in FIG. 16, and FIG. 17B shows an EDX spectrum at a measurement position PB outside the grain boundary triple point 191 shown in FIG. 16.

It is determined, from a difference in brightness between the grain boundary triple point 191 and the surroundings in the image shown in FIG. 16, that the different phase 152 is present at the grain boundary triple point 191. It is determined that the different phase 152 contains silver because a peak of silver not detected in the EDX spectrum in FIG. 17B is detected in the EDX spectrum in FIG. 17A.

Furthermore, five different positions were extracted from the range of the bonding layer 13 included in the field of view of each of the STEM images shown in FIGS. 11A and 11B, and a selected area electron diffraction pattern was measured. FIG. 18 shows a BF-STEM image showing the five extracted positions P11, P12, P13, P14, and P15, in substantially the same field of view as that in FIG. 11A. The extracted position P11 is selected from the second interface layer 123. The extracted positions P12 and P14 are selected from the intermediate layer 122. The extracted position P13 is selected from the portion of the first interface layer 121 other than the nanoparticle layer 131. The extracted position P15 is selected from the nanoparticle layer 131.

It was confirmed, from results of measurement, that $Ti_5Si_3$ was present at the extracted position P11, TiN was present at the extracted positions P13 and P15, and $TiSi_{0.51}N_{0.42}$ was present at the extracted positions P12 and P14.

Distribution of concentrations of nitrogen, oxygen, and titanium was measured on a portion of the field of view of the HAADF-STEM image shown in FIG. 15 by electron energy loss spectroscopy (EELS). FIGS. 19A to 19D show a region targeted for measurement and EELS intensity maps showing distribution of the respective elements in the region. Specifically, FIG. 19A shows a rectangular measurement region R in the same HAADF-STEM image as that in FIG. 15, and FIGS. 19B, 19C, and 19D show EELS intensity maps respectively showing distribution of the concentrations of nitrogen, oxygen, and titanium in the region R. It is confirmed from FIGS. 19B, 19C, and 19D that the oxygen containing layer 132 is present along the first interface 111 in the ceramic substrate 11.

Example 2

In this example, a peel test of the copper plate 12 was conducted on the bonded substrate 1 manufactured on the same condition as that in Example 1 to evaluate adhesion of the copper plate 12. A bonded substrate manufactured by a method disclosed in Japanese Unexamined Patent Application Publication No. 2018-506496 was prepared as a comparative example, and the peel test was conducted on the same condition. The bonded substrate according to the comparative example was formed to discretely include an Ag-rich phase but include no void and Ag—Cu layer between the copper plate and the bonding layer.

The peel test was conducted by holding the end of the copper plate at a width of 2 mm with the bonded substrate targeted for the test being secured in a horizontal position, and applying a vertically upward tensile force to the held portion. The tensile force was gradually increased until the copper plate is peeled, and the magnitude of the tensile force per unit width when the copper plate is eventually peeled was set to the bonding strength between the copper plate and the ceramic substrate in the bonded substrate.

As a result, the bonded substrate 1 according to the example had a bonding strength of 40 kN/m. On the other hand, the bonded substrate according to the comparative example had a bonding strength of only 20 kN/m.

The results show that a bonded substrate having a higher bonding strength than a conventional bonded substrate can be obtained by manufacturing the bonded substrate by the method according to the above-mentioned embodiment.

What is claimed is:

1. A bonded substrate comprising:
a silicon nitride ceramic substrate;
a copper plate; and
a bonding layer bonding the copper plate to the silicon nitride ceramic substrate, wherein
the bonding layer has a first interface in contact with the silicon nitride ceramic substrate and a second interface in contact with the copper plate, and contains a nitride and a silicide each of an active metal as at least one metal selected from the group consisting of titanium and zirconium,
an atomic fraction of nitrogen of the bonding layer is greatest at the first interface and is smallest at the second interface, and
a sum of atomic fractions of the active metal and silicon of the bonding layer is smallest at the first interface and is greatest at the second interface.

2. The bonded substrate according to claim 1, wherein the atomic fractions of the active metal and silicon of the bonding layer are each smallest at the first interface and greatest at the second interface.

3. The bonded substrate according to claim 2, wherein the bonding layer includes a first-interface-side interface layer present along the first interface and containing the nitride of the active metal as a major component.

4. The bonded substrate according to claim 3, wherein the first-interface-side interface layer includes a nanoparticle layer including a plurality of nanoparticles each having a particle size of 50 nm or less, the nanoparticle layer being in contact with the first interface.

5. The bonded substrate according to claim 4, wherein the nanoparticle layer contains a greater atomic fraction of silver and copper than a portion of the first-interface-side interface layer other than the nanoparticle layer, and
the plurality of nanoparticles contain more silver than a portion of the nanoparticle layer around the plurality of nanoparticles.

6. The bonded substrate according to claim 3, wherein the active metal includes titanium,
the nitride of the active metal includes titanium nitride having a composition represented by a formula $TiN_x$, and
the first-interface-side interface layer contains the titanium nitride as a major component.

7. The bonded substrate according to claim 2, wherein the bonding layer includes a second-interface-side interface layer present along the second interface and containing the silicide of the active metal as a major component.

8. The bonded substrate according to claim 7, wherein the silicide includes titanium silicide having a composition represented by a formula $Ti_5Si_3$, and
the second-interface-side interface layer contains the titanium silicide as a major component.

9. The bonded substrate according to claim 1, wherein the bonding layer includes an intermediate layer containing, as a major component, a solid solution of silicon and titanium nitride having a composition represented by a formula $TiN_x$, and present away from the first interface and the second interface.

10. The bonded substrate according to claim 9, wherein copper forms a solid solution with the bonding layer, and an atomic fraction of copper of the bonding layer is greatest in the intermediate layer.

11. The bonded substrate according to claim 10, wherein an atomic fraction of copper of the intermediate layer is 1 at. % or more and 10 at. % or less.

12. The bonded substrate according to claim 1, wherein the bonding layer includes:
a plurality of particles forming a grain boundary triple point; and
a different phase present at the grain boundary triple point and containing silver as a major component.

13. The bonded substrate according to claim 1, wherein the silicon nitride ceramic substrate includes an oxygen containing layer present along the first interface.

\* \* \* \* \*